United States Patent
Emesh et al.

(10) Patent No.: US 6,572,755 B2
(45) Date of Patent: Jun. 3, 2003

(54) METHOD AND APPARATUS FOR ELECTROCHEMICALLY DEPOSITING A MATERIAL ONTO A WORKPIECE SURFACE

(75) Inventors: Ismail Emesh, Gilbert, AZ (US); Saket Chadda, Phoenix, AZ (US); Nikolay Korovin, Phoenix, AZ (US); Brian Mueller, Chandler, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 212 days.

(21) Appl. No.: 09/832,657

(22) Filed: Apr. 11, 2001

(65) Prior Publication Data

US 2002/0148732 A1 Oct. 17, 2002

(51) Int. Cl.[7] .............................. C25B 9/00; C25D 5/00; C25D 5/02; C25D 5/52; C25P 17/00
(52) U.S. Cl. .................... 205/137; 205/88; 205/118; 205/222; 204/198; 204/224 R; 204/224 M; 204/241; 204/279
(58) Field of Search .................... 205/88, 137, 222, 205/224, 118; 204/224 R, 212, 198, 224 M

(56) References Cited

U.S. PATENT DOCUMENTS

| | | | |
|---|---|---|---|
| 3,779,887 A | * 12/1973 | Gildone | 204/271 X |
| 4,713,149 A | * 12/1987 | Hoshino | 204/217 X |
| 4,793,895 A | 12/1988 | Kaanta et al. | |
| 5,081,421 A | 1/1992 | Miller et al. | |
| 5,492,594 A | 2/1996 | Burke et al. | |
| 5,723,387 A | 3/1998 | Chen | |
| 5,807,165 A | 9/1998 | Uzoh et al. | |
| 5,911,619 A | 6/1999 | Uzoh et al. | |
| 6,004,880 A | 12/1999 | Liu et al. | |
| 6,017,437 A | 1/2000 | Ting et al. | |
| 6,066,030 A | 5/2000 | Uzoh | |
| 6,090,239 A | 7/2000 | Liu et al. | |
| 6,110,011 A | 8/2000 | Somekh et al. | |
| 6,121,152 A | 9/2000 | Adams et al. | |
| 6,132,586 A | 10/2000 | Adams et al. | |
| 6,143,155 A | 11/2000 | Adams et al. | |
| 6,171,467 B1 | 1/2001 | Weihs et al. | |
| 6,176,992 B1 | 1/2001 | Talieh | |
| 6,251,236 B1 | 6/2001 | Stevens | |
| 6,294,059 B1 | 9/2001 | Hongo et al. | |
| 6,328,872 B1 | 12/2001 | Talieh et al. | |

FOREIGN PATENT DOCUMENTS

WO     WO 00/26443     5/2000

* cited by examiner

Primary Examiner—Donald R. Valentine
(74) Attorney, Agent, or Firm—Snell & Wilmer, L.L.P.

(57) ABSTRACT

An electrochemical deposition apparatus and method for depositing a material onto a surface of a workpiece and for polishing the material are disclosed. The apparatus includes a platen and a polishing surface, including a conductive material and conductors embedded therein, disposed proximate the platen. During material deposition, a bias is applied across the conductor and the platen to cause deposition of material onto the workpiece surface.

79 Claims, 6 Drawing Sheets

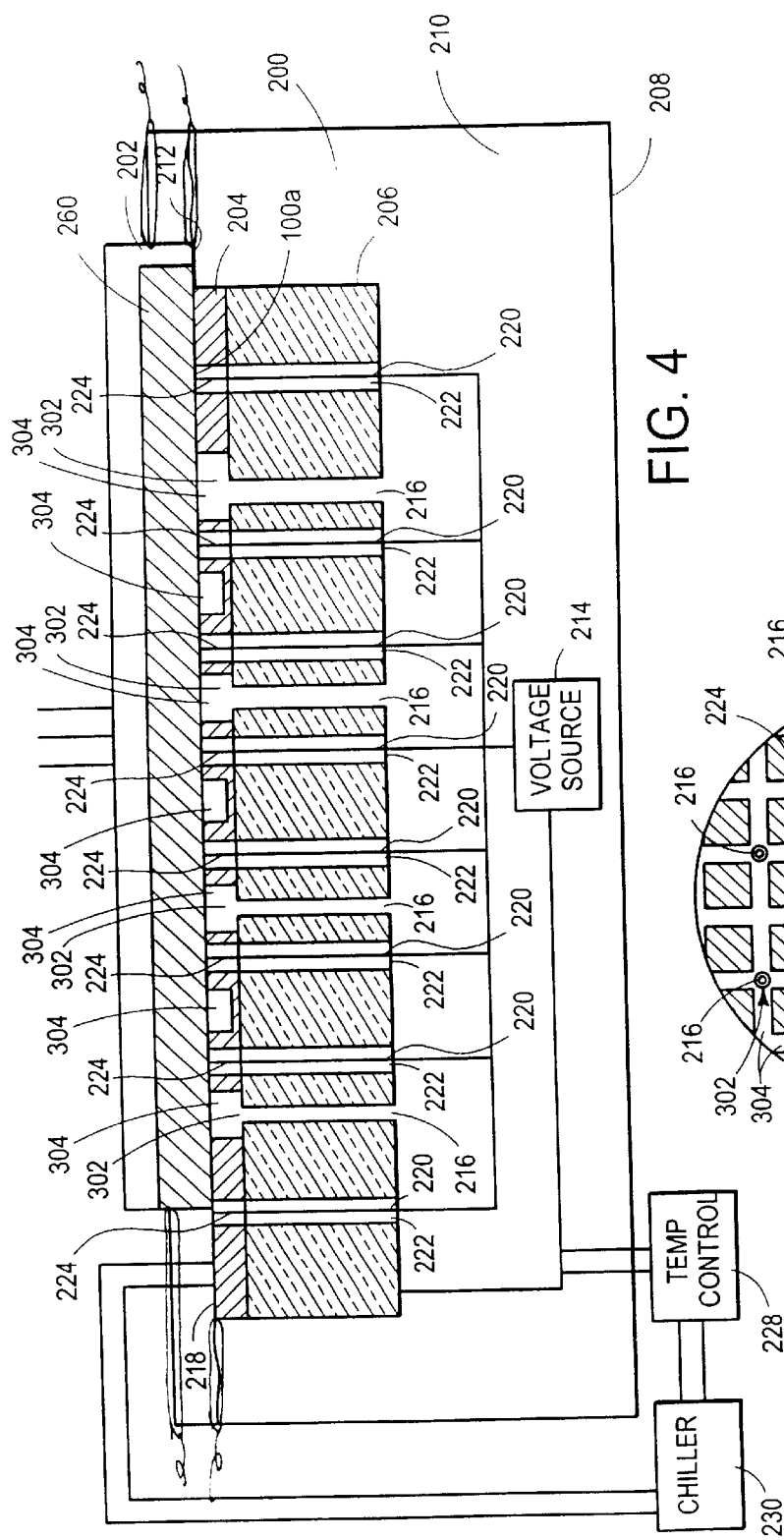
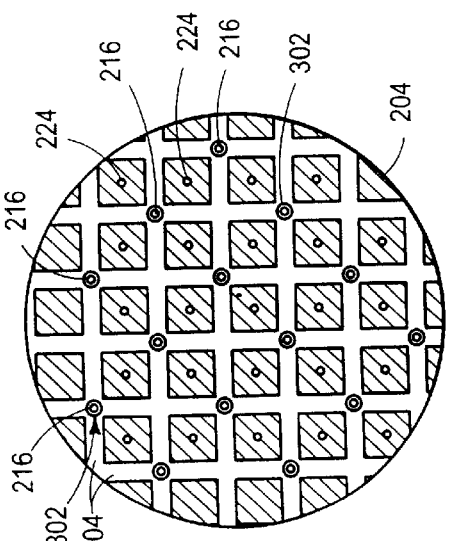
FIG. 4
FIG. 5

METHOD AND APPARATUS FOR ELECTROCHEMICALLY DEPOSITING A MATERIAL ONTO A WORKPIECE SURFACE

TECHNICAL FIELD

The present invention relates, generally, to techniques for depositing conductive material onto a workpiece, such as a semiconductor wafer. More particularly, the invention relates to an apparatus, a system, and a method for both electrolytically depositing the conductive material onto the workpiece surface and polishing the surface of the workpiece to remove a portion of the conductive material.

BACKGROUND

Microelectronic circuits generally include conductive features such as via plugs, metal lines, and the like to interconnect various portions or layers of the circuit. The conductive features of the microelectronic circuits include conductive material such as metal and often include a barrier material to reduce unwanted diffusion of the conductive material and promote adhesion between the conductive material and an adjacent layer of the circuit.

Aluminum is often used to form conductive features because aluminum features are relatively easy to manufacture using conventional deposition (e.g., chemical vapor deposition) and etch (e.g., reactive ion etch) techniques. While use of aluminum to form conductive features is adequate for some circuits, the use of aluminum to form conductive features becomes increasingly problematic as the size of the conductive feature decreases. In particular, as the size of the conductive feature decreases, the current density through the feature generally increases and thus the feature becomes increasingly susceptible to electromigration, i.e., the mass transport of metal due to the current flow. Electromigration may cause short circuits where the metal accumulates, opens where the metal has been depleted, or other circuit failures. Similarly, increased conductive feature resistance may cause unwanted device problems such as excess power consumption or heat generation.

Recently, techniques have been developed to form conductive features comprising copper, which is less susceptible to electromigration and which exhibits a lower resistivity than aluminum. Because copper does not readily form volatile or soluble compounds, the copper conductive features are often formed using damascene technology. More particularly, the copper conductive features are formed by creating a via within an insulating material, blanket depositing a barrier layer onto the surface of the insulating material and into the via, blanket depositing a seed layer of copper onto the barrier layer, electrodepositing a copper layer onto the seed layer to fill the via, and removing any excess barrier material and copper from the surface of the insulating material using chemical mechanical polishing. During the eletrodeposition process, additives such as leveling agents are continuously or regularly added to the plating bath to reduce formation of voids within the conductive features. Such leveling agents may affect the grain boundaries of the deposited material, necessitating a subsequent anneal process to obtain the desired material properties.

Forming copper conductive features according to the method described above can be relatively expensive, in part, because each material deposition and removal step is typically carried out using dedicated equipment. U.S. Pat. No. 6,176,922, issued to Talieh on Jan. 23, 2001 discloses an apparatus for both electroplating copper and polishing the copper. The apparatus disclosed in Talieh includes a wafer carrier having a cathode electrode contact, which contacts the surface of the wafer to be polished. The apparatus disclosed in Talieh may be problematic in several regards. In particular, a film deposited using the apparatus of Talieh may be undesirably non-uniform because the cathode electrode contacts the wafer in a limited number of fixed locations about a perimeter of the wafer. Such a cathode contact configuration may lead to increased deposition about the perimeter of the wafer (in the areas proximate the cathode contact) and thus lead to non-uniform deposition of the conductive film. Furthermore, wafer areas in contact with the cathode generally cannot include active devices. Accordingly, improved methods and apparatus for electrochemically depositing a film and for polishing the film are desired.

SUMMARY OF THE INVENTION

The present invention provides improved apparatus and methods for forming conductive features on a surface of a workpiece. More particularly, the invention provides an improved apparatus capable of both depositing material onto a surface of a workpiece and polishing the workpiece surface and a method of forming conductive features using the apparatus. While the ways in which the invention addresses the drawbacks of the now-known deposition and polishing apparatus are addressed in greater detail below, in general, the apparatus in accordance with the present invention provides a cathode contact embedded in a polishing surface, such that the workpiece can move relative to the cathode contact during material deposition.

In accordance with an exemplary embodiment of the present invention, an electrochemical deposition apparatus includes a polishing platen having a polishing surface and a tank including an electrolyte solution. Electrodeposition results when a sufficient bias is applied between the platen and a workpiece surface, which is in contact with the solution. In accordance with one aspect of this embodiment, a potential is applied to the workpiece surface using connectors embedded within the polishing surface and electrically insulated from the platen. Because the workpiece receives a potential from connectors embedded within the polishing surface, rather than from a wafer carrier, more workpiece surface is available for conductive feature formation and potentially more uniform films may be deposited.

In accordance with a further embodiment of the invention, the polishing surface includes a polishing pad attached to the platen to facilitate removal of conductive material from the surface of the workpiece. In accordance with one aspect of the invention, the polishing pad includes apertures to allow a portion of the connectors to contact the surface of the workpiece. The pad may also include channels for electrolyte solution flow and groves on the surface of the polishing pad to facilitate mass transport of the solution to and from the workpiece surface.

In accordance with yet a further embodiment of the invention, the apparatus includes a temperature control device and a chiller to cool solution applied to the workpiece surface.

In accordance with an alternative embodiment of the invention, a workpiece carrier includes a heat exchanger.

In accordance with yet another embodiment of the invention, a polishing platen includes a heat exchanger.

In accordance with yet a further embodiment of the present invention, the electrochemical planarization apparatus includes an endpoint detection apparatus configured to detect an endpoint of a deposition and planarization process of a workpiece.

In accordance with a further embodiment of the invention, a conductive feature is formed on a surface of a workpiece by placing a workpiece surface in contact with a polishing surface having electrical conductors embedded therein and applying a bias between the workpiece and a polishing platen in the presence of an electrolyte. In accordance with one aspect of this embodiment, the workpiece and the polishing surface move relative to each other during the deposition process.

BRIEF DESCRIPTION OF THE DRAWINGS

Exemplary embodiments of the present invention will hereafter be described in conjunction with the appended drawing figures, wherein like designations denote like elements, and:

FIG. 4 is a cross-sectional illustration of a portion of a electrochemical deposition apparatus in accordance with an exemplary embodiment of the present invention;

FIG. 5 is a top-view illustration of a polishing surface in accordance with an embodiment of the present invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
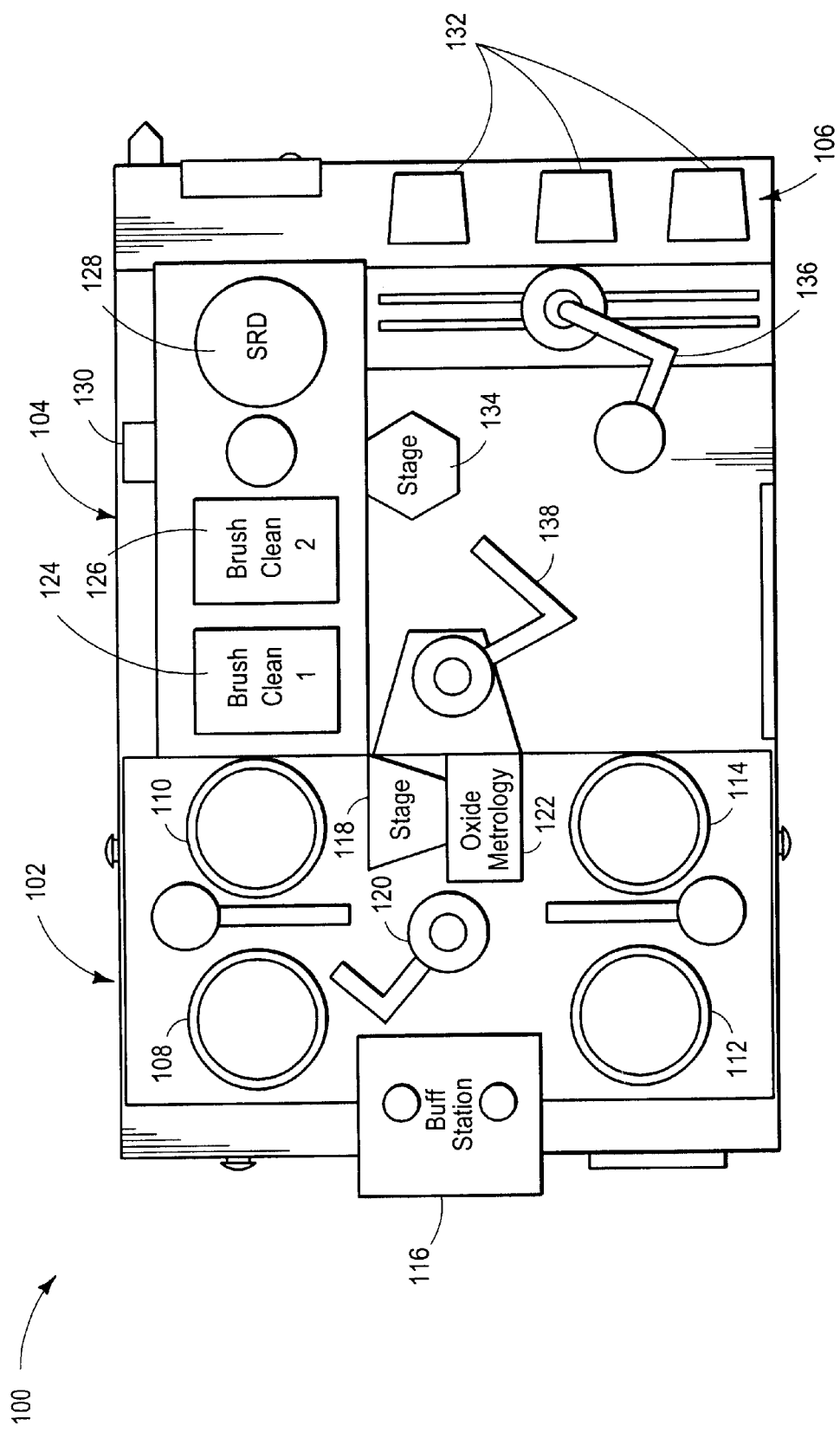
FIG. 1 is a top cut-away illustration of an electrochemical polishing apparatus in accordance with an exemplary embodiment of the present invention.

FIG. 1 illustrates a top cut-way view of a polishing apparatus 100, suitable for electrochemically depositing conductive material onto a surface of a workpiece in accordance with the present invention. Apparatus 100 includes a multi-platen polishing system 102, a clean system 104, and a wafer load and unload station 106. Although the present invention may be used to deposit conductive material onto a variety of workpieces, the invention is conveniently described below in connection with depositing material onto a surface of a wafer. The term "wafer" shall mean semiconductor substrates, which may include layers of insulating, semiconducting, and conducting layers or features formed thereon, used to manufacture microelectronic devices.

Exemplary polishing system 102 includes four polishing stations 108, 110, 112, and 114, which each operate independently; a buff station 116; a stage 118; a robot 120; and optionally, a metrology station 122. Polishing stations 108–114 may be configured as desired to perform specific functions; however, in accordance with the present invention, at least one of stations 108–114 includes an electrochemical deposition polishing apparatus as described herein. The remaining polishing stations may be configured for electrochemical polishing processes, traditional chemical mechanical polishing, or the like.

Clean station 104 is generally configured to remove debris such as slurry residue and material removed from the wafer surface during polishing. In accordance with the illustrated embodiment, station 104 includes clean stations 124 and 126, a spin rinse dryer 128, and a robot 130.

Wafer load and unload station 106 is configured to receive dry wafers for processing in cassettes 132. In accordance with the present invention, the wafers are dry when loaded onto station 106 and are dry before return to station 106.

In accordance with an alternate embodiment of the invention, clean station 104 may be separate from the electrochemical deposition apparatus. In this case, load station 106 is configured to receive dry wafers for processing, but the wafers may remain in a wet state after plating or polishing and before transfer to a clean station.

In operation, cassettes 132, including one or more wafers, are loaded onto apparatus 100 at station 106. The wafers are then individually transported to a stage 134 using a dry robot 136. A wet robot 138 retrieves a wafer at stage 132 and transports the wafer to metrology station 122 for film characterization or to stage 118 within polishing system 102. Robot 120 picks up the wafer from metrology station 122 or the stage and transports the wafer to one of polishing stations 108–114 for electrochemical polishing deposition of a conductive material. After a desired amount of material is deposited onto the wafer surface, a portion of the deposited material and, if desired, other materials may be removed by transporting the wafer to another polishing station. Alternatively, as discussed below, a polishing environment within one of the stations may be changed from an environment suitable for electrochemical deposition to an environment suitable for electrochemical polishing—e.g., by changing the solution and the bias applied to the wafer. In this case, a single polishing station may be used to both deposition of material and removal of material.

After conductive material has been deposited onto the wafer surface and a desired amount of the material has been removed, the wafer is transferred to buff station 116 to further polish the surface of the wafer. After the polishing and/or buff process, the wafer is transferred to stage 118. In accordance with one embodiment of the invention, stage 118 is configured to maintain one or more wafers in a wet, e.g., deionized water, environment.

After a wafer is placed in stage 118, robot 138 picks up the wafer and transports the wafer to clean system 104. In particular, robot 138 transports the wafer to robot 130, which in turn places the wafer in one of clean stations 124, 126. The wafer is cleaned using one or more stations 124, 126 and is then transported to spin rinse dryer 128 to rinse and dry the wafer prior to transporting the wafer to load/unload station 106 using robot 136.

Figure 2:
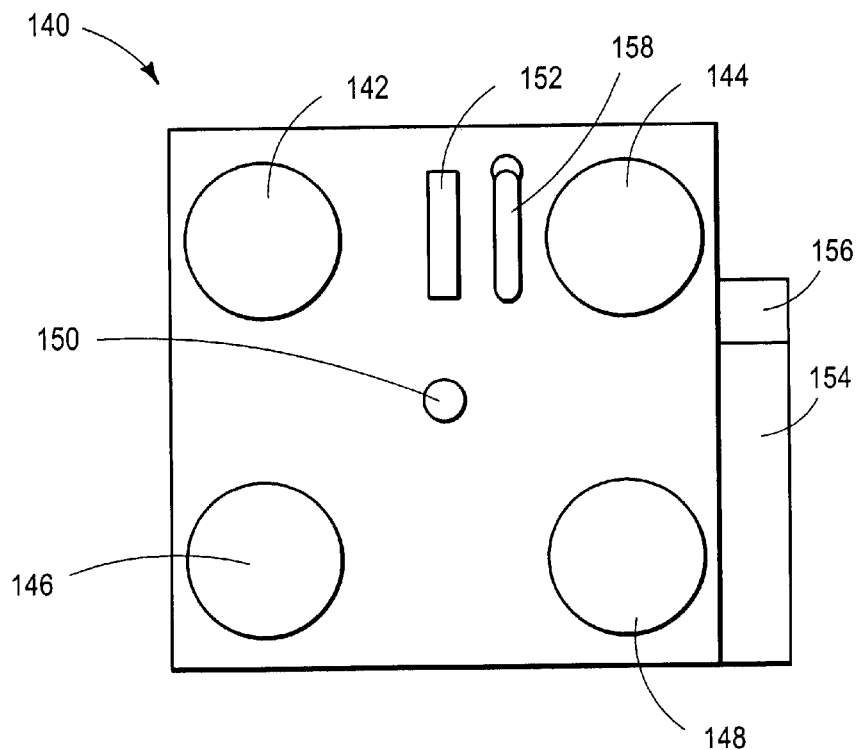
FIG. 2 is a top cut-away illustration of a portion of a electrochemical polishing apparatus in accordance with another embodiment of the present invention.
Figure 3:
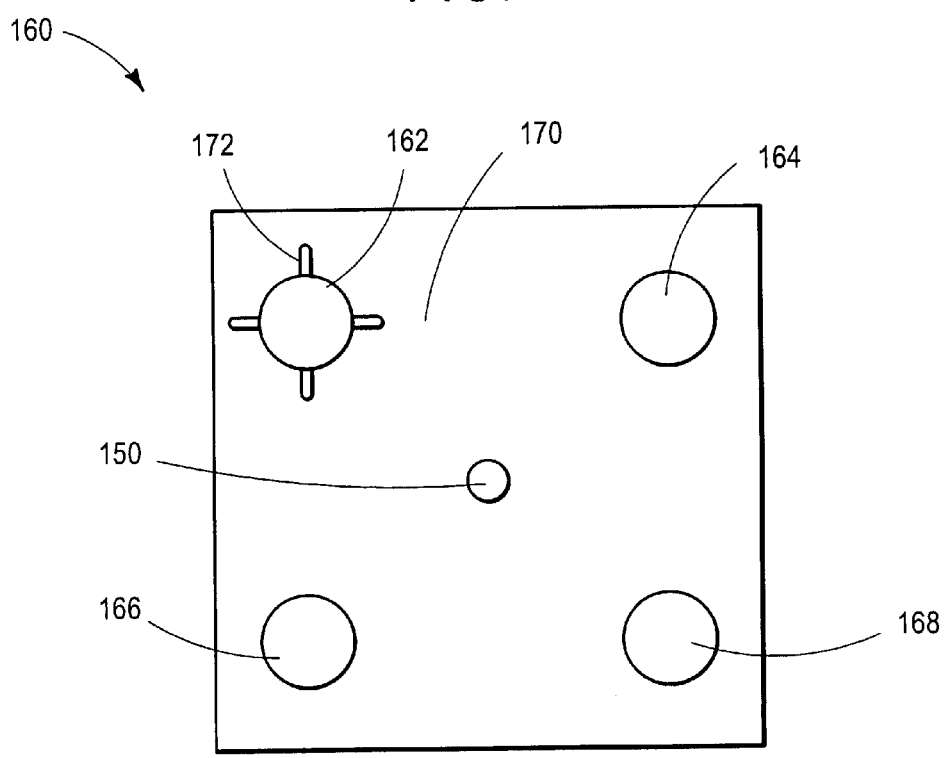
FIG. 3 is a bottom cut-away view of a carousel for use with the apparatus of FIG. 2.

FIG. 2 illustrates a top cut-away view of another exemplary polishing apparatus 140, configured to electrochemically deposit material onto a wafer surface and remove a portion of the deposited material. Apparatus 140 is suitably coupled to carousel 160, illustrated in FIG. 3, to form an automated electrochemical polishing system. An electrochemical polishing system in accordance with this embodiment may also include a removable cover (not illustrated in the figures) overlying apparatus 140 and 160.

Apparatus 140 includes three polishing stations 142, 144, and 146, of which at least one is configured for electrochemical deposition, as described below, a wafer transfer station 148, a center rotational post 150, which is coupled to carousel 160, and which operatively engages carousel 160 to cause carousel 160 to rotate, a load and unload station 154, and a robot 156. Furthermore, apparatus 140 may include one or more rinse washing stations 152 to rinse and/or wash a surface of a wafer before or after a polishing or electrodeposition process. Although illustrated with three polishing stations, apparatus 140 may include any desired number of polishing stations and one or more of such polishing stations may be used to buff a surface of a wafer as described herein.

Each polishing stations 142–146 include a platen and a polishing surface attached thereto as described herein. In addition, one or more stations 142–146 may include a pad conditioner 158 to condition the surface of the polishing surface.

Wafer transfer station 148 is generally configured to stage wafers before or between polishing and/or buff operations and may be further configured to wash and/or maintain the wafers in a wet environment.

Carousel apparatus 160 includes polishing heads 162, 164, 166, and 168, each configured to hold a single wafer and urge the wafer against a polishing surface (e.g., a polishing surface associated with one of stations 142–146). Each carrier 162–168 is suitably spaced from post 150, such that each carrier aligns with a polishing station or station 148. In accordance with one embodiment of the invention, each carrier 162–168 is attached to a rotatable drive mechanism using a gimbal system (not illustrated), which allows carriers 162–168 to cause a wafer to rotate (e.g., during a deposition process). In addition, the carriers may be attached to a carrier motor assembly that is configured to cause the carriers to translate radially—e.g., along tracks 170 and 172. In accordance with one aspect of this embodiment, each carrier 162–168 rotates and translates independently of the other carriers.

In operation, wafers are processed using apparatus 140 and 160 by loading a wafer onto station 148, from station 154, using robot 156. One of wafer carriers 162–168 is lowered over the wafer and a vacuum is applied between the wafer and the carrier, such that the carrier engages the wafer. When a desired number of wafers are loaded onto the carriers, at least one of the wafers is placed in contact with an electrochemical polishing station in accordance with the present invention. The wafer may then be polished and/or buffed in accordance with various embodiments of the invention.

A schematic representation of an apparatus 200 for electrochemical deposition (e.g., a portion of one of stations 108–114 or stations 142–146) of the present invention is illustrated in FIG. 4. In accordance with one embodiment of the invention, apparatus 200 is configured to perform polishing or planarization in addition to electrochemical deposition to form conductive features on a surface of a wafer.

Apparatus 200 includes a wafer carrier assembly 202, a polishing surface 204 (e.g., a polishing pad), a platen 206, a tank 208, and an electrolyte solution 210. In general, apparatus 200 is configured to electrochemically deposit material onto a surface of a wafer 212 coupled to assembly 202 and is further configured to polish or remove material from a surface of the wafer. Electrochemical deposition results from applying a bias between wafer 212 and platen 206 in the presence of electrolyte solution 210 and polishing of the surface results by placing wafer 212 in contact with surface 204 and moving wafer 212 and surface 204 relative to each other. Apparatus 200 allows for the formation of conductive features such as copper plugs, with reduced equipment requirements, reduces an amount of material that must be removed from the surface of the wafer after the deposition process, and may reduce an amount of leveling agents required in the electrolyte solution. Furthermore, because less or no leveling agents are required to form conductive features using the apparatus of the present invention, the conductive features may not require annealing or may require less annealing to adjust the grain structure of the deposited material.

To facilitate electrochemical deposition, platen 206 includes a conductive material such as tantalum, gold, or platinum, which is relatively inert with respect to solution 210. Platen 206 may be formed entirely of the inert, conductive material, or alternatively, may be formed of a material such as aluminum, coated with an inert, conductive material such as platinum, gold, or titanium. Platen 206 is suitably connected to a power source 214 which is configured to establish an electric potential difference between platen 206 and wafer 212, as described in more detail below.

Platen 206 is also generally configured to move relative to assembly 202 to facilitate polishing of wafer 212 and promote uniform deposition of material onto a surface of wafer 212. Platen 206 may be connected to a driver or motor assembly (not shown) that is operative to rotate platen 206 and polishing surface 204 about a vertical axis. It will be appreciated, however, that the driver or motor assembly may be operative to move platen 206 and polishing surface 204 in an orbital, linear, rotational, or oscillatory pattern or any combination thereof. Alternatively, relative motion between assembly 202 and surface 204 may be obtained solely by moving assembly 202 with respect to a stationary platen 206.

In accordance with an exemplary embodiment of the invention, platen 206 includes one or two, but preferably a plurality of channels 216 for the transportation of an electrolyte solution to a surface 218 of polishing surface 204 from a manifold apparatus (not shown) or any suitable fluid distribution system. Alternatively, it will be appreciated that the electrolyte solution may be deposited directly on or through surface 218 by a conduit or any suitable application mechanism.

In accordance with the present invention, an electric potential difference is effected between platen 206 and the surface of wafer 212 by applying a relatively negative potential to the surface of wafer 212 using electrical conductors 220, which are embedded within polishing surface 204. Conductors 220 are coupled to power source 214, which generates a bias between connectors 220 and platen 206, which is also coupled to power source 214. In particular, power source 214 applies a relative positive charge to platen 206 and applies a relative negative charge to electrical conductors 220. The relative negative charge is transmitted to the surface of wafer 212 using connectors 220, which are electrically isolated from platen 206. Positioning of the electrical conductors within the polishing surface facilitates creation of a uniform electric potential gradient across the surface of the wafer, reducing the likelihood that edge effects and the like may result. Furthermore, because the cathode electrodes are not attached directly to the surface of wafer 212, a greater amount of surface area of wafer 212 is available for device formation.

The distance between the surface of wafer 212 and platen 206 is an important factor in the uniformity of films deposited using apparatus 200. The distance may be less than 3 mm but is preferably less than 1 mm and is more preferably less than 2000 angstroms. However, to avoid shorting of the circuit formed from platen 206 through the electrolyte solution to the wafer surface, the platen should not contact the surface of wafer 160.

In accordance with an exemplary embodiment of the invention, at least one electrical conductor 220 is positioned within platen 206. While FIG. 4 shows a plurality of electrical conductors 220 positioned within platen 206, it will be appreciated that one, two or any suitable number of electrical conductors 220 may be positioned within platen 206. Electrical conductors 220 are connected at a first end to a power source 214 and are insulated from platen 206 by insulation elements 222. Each of the electrical conductors 220 may include at a second end a contact element 224. At least a portion of contact element 224 is positioned within polishing surface 204. A top surface 226 of contact element 220 may be positioned above or below top surface 218 of polishing surface 204, but is preferably positioned flush with top surface 218 of polishing surface 204. Contact element 220 is formed of any suitable material that exhibits low electrical resistance, resistance to corrosion and deposition, and a material hardness that is less than the hardness of the material that comprises the surface of wafer 212. For example, if the surface of wafer 212 is formed of copper, contact element 224 may be formed of a conductively-enhanced polymer material, ceramic material or inorganic fibers such as, for example, carbon fibers.

Solution 210 is an electrolyte solution that includes suitable precursors to the material to be deposited onto the surface of wafer 212. In accordance with one exemplary embodiment of the invention, solution 210 includes a copper plating solution. Such solutions are generally known in the art and typically include dissolved copper salts such as copper sulfate, leveling agents, suppressants, and accelerators.

Polishing surface 204 is suitably formed of an insulating material such as a polymeric material, a polymetric/inorganic composite "fixed abrasive" material, or a ceramic insulator material as are used in chemical mechanical polishing of conductive films. The hardness and density of polishing surface 204 are selected based on the type of material to be polished or removed. Blown polyurethane pads, such as the IC and GS series of pads available from Rodel Products Corporation of Scottsdale, Ariz., may be advantageously used to polish wafer 212, although it will be appreciated that any suitable polishing pad or surface may be used in accordance with the present invention. Polishing surface 204 has a thickness which may range from approximately 200 angstroms to approximately 3 mm. However, the current density and, accordingly, the deposition rate of the of material onto a surface of wafer 212 is inversely proportional to the distance between platen 206, which acts as an anode when an electric potential is applied, and the surface of wafer 212, which acts as an cathode during material deposition.

Figure 6:
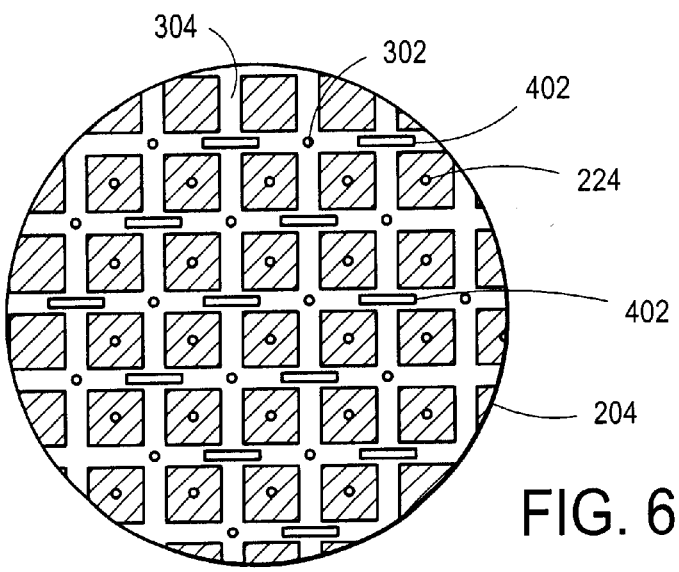
FIG. 6 is a top-view illustration of a polishing surface in accordance with another exemplary embodiment of the present invention.

FIG. 5 illustrates a top view of polishing surface 204. As illustrated in both FIGS. 4 and 5, and in accordance with an exemplary embodiment of the invention, polishing surface 204 includes apertures 302 through which the electrolyte may flow. In accordance with one aspect of this embodiment, apertures 302 are aligned with channels 216 formed within platen 206, such that electrolyte solution may circulate through platen 206 and polishing surface 204. Because polishing surface 204 is formed of insulating material, apertures 302 may also be configured to direct electric fields between platen 206 and wafer 212. In accordance with one aspect of this embodiment, polishing surface 204 includes grooves 304. Grooves 304 are configured to effect transportation of the electrolyte solution on polishing surface 204 during a polishing process. Polishing surface 204 may also be porous, further facilitating transportation of the electrolyte solution. In an alternative embodiment, as illustrated in FIG. 6, polishing surface 204 may have cut-out portions, or "windows" 402, preferably positioned within grooves 304, which expose portions of platen 206 to create desired electrical fields between platen 206 and the surface of wafer 212. It will be appreciated, however, that polishing surface 204 may have any suitably-shaped openings that are configured to produce a uniform or other desired electric field at desired areas of the wafer.

The apparatus of the present invention may also include a temperature control mechanism 228. The temperature of the surface of wafer 212 during electrochemical deposition may have a significant effect on the uniformity of the deposited conductive film, the quality of the deposited film, and the rate of deposition of the film. If, for example, the temperature is too high in a given area, the deposition rate may increase in that area, causing non-uniform film deposition on the surface of wafer 212. To counteract the generation of localized hot spots, in one embodiment of the present invention, the electrolyte solution may be cooled before being delivered to the surface 218 of polishing surface 204. In this embodiment, the electrolyte solution may be subjected to a chiller 230 before being delivered to surface 218.

In an alternative embodiment of the invention, the temperature of the electrochemical deposition process may be controlled by providing a heat exchange fluid to the backside of wafer 212. Apparatus for exposing a heat exchange fluid to the backside of a wafer are well known in the art. For an example of an apparatus configured to regulate the polishing rate of a wafer by backside heat exchange, see U.S. Pat. No. 5,605,488, issued to Ohashi et al. on Feb. 25, 1997, which patent is hereby incorporated by reference.

Figure 7:
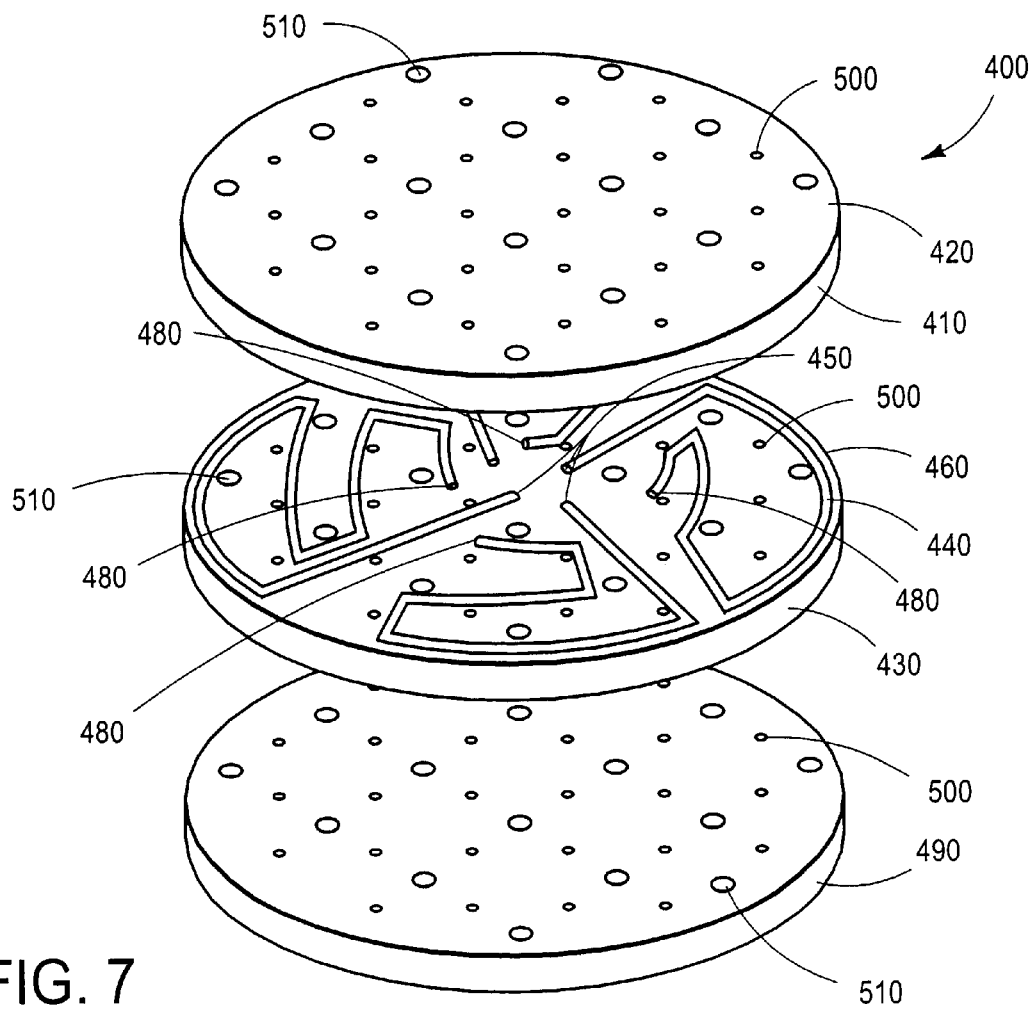
FIG. 7 is an exploded-perspective illustration of a platen including a heat exchanger in accordance with another exemplary embodiment of the present invention.

The temperature of the electrochemical deposition process may also be regulated by providing a heat conductive platen configured to be temperature controlled by a heat exchange fluid circulating therethrough. Although there are a number of methods to fabricate such a platen, only one of those methods is illustrated herein. Referring to FIG. 7, in accordance with one embodiment of the invention, a platen 400 is fabricated from a material having a high thermal conduction coefficient to facilitate control of the processing temperature. Platen 400 may be constructed in three pieces that are connected together by belts, rivets or, preferably, by brazing to form a unitary platen. Platen 400, in this embodiment, is formed from a substantially circular cover plate 410 that has a substantially planar upper surface 420 to which a polishing surface such as a pad can be attached, for example, with an adhesive. In this embodiment, platen 400 further includes a channel section 430 that includes channel grooves 440. Preferably, channel grooves 440 are configured in a serpentine pattern. A heat exchange fluid flows from inlets 450 near the center or axis of platen 400 to a location near the periphery 460 of the platen and then, in a serpentine pattern to exits 480 again located near the center or axis of platen 400. Platen 400 is completed by a bottom section 490 that includes on its bottom surface (not shown) a configuration for the attachment of the platen to a platen shaft.

In an alternative method (not illustrated) for fabricating platen 400, the channel groove is formed in the underside of the cover plate. The channel groove may be sealed by attaching a circular disk having a planar top surface to the underside of the cover plate. The bottom section is attached to the circular disk, or, alternatively, the junction of the circular disk and the bottom section could be combined. In either this method or the illustrated method, a channel groove through which a heat exchange fluid can be circulated is formed beneath the substantially planar surface of the platen assembly.

Cover plate 410, channel section 430, and bottom section 490 each have a first set of channels 500, similar to channels 216 as referenced in FIG. 4, through which an electrolyte solution may flow. Channels 500 in cover plate 410 are colinear with channels 500 in channel section 430, which in turn are colinear with channels 500 in bottom section 490. A manifold apparatus (not shown) may be connected to bottom section 490 to deliver the electrolyte solution through channels 500 of the bottom section, the channel section, and the cover plate to the polishing pad.

In addition to channels 500, cover plate 410, channel section 430, and bottom section 490 may suitably include bores 510. Bores 510 in cover plate 410 are colinear with bores 510 in channel section 430, which in turn are colinear with bores 510 in bottom section 490. When the cover plate, channel section, and bottom section are connected together to form unitary platen 400, electrical conductors 200 may be seated within bores 510.

A method for simultaneously electrochemically depositing material onto a surface of wafer 212 and polishing a surface of wafer 212 will now be described. Although the illustrated method includes simultaneously polishing the wafer surface and depositing material onto the wafer surface, alternative embodiments of the invention include intermittently depositing material onto the surface and polishing the wafer surface.

Referring again to FIG. 4, wafer carrier assembly 202 urges wafer 212 against polishing surface 204 such that wafer 212 engages polishing surface 204 at a desired pressure. Preferably, the wafer carrier applies a uniform and constant pressure of approximately 2 psi or less, although it may be appreciated that any suitable pressure which promotes polishing without interfering with the concurrent electrochemical deposition process may be used. Alternatively, to further control the rate of material removal and/or deposition, the wafer carrier may press the wafer against the polishing pad for a predetermined amount of time, subsequently withdraw the wafer from the polishing pad for a predetermined amount of time, and then repeat the pressing/withdrawing pattern a desired number of times. For example, the wafer carrier may "bump" the wafer against the polishing pad for a predetermined number of times to control the removal rate of the material on the wafer surface.

During the polishing process, an electrolyte solution is delivered to the surface of polishing surface 204 through channels 216 and apertures 302. An electric potential is also applied to create a circuit between platen 206 and the surface of wafer 212. Power source 214 may be configured to apply a constant current or voltage to the apparatus or, alternatively, the current or voltage could be modulated to apply different currents or voltages at predetermined times in the process or to modulate between a predetermined current or voltage and no current or no voltage.

Wafer carrier assembly 202 and wafer 212 may rotate about an axis 232 while platen 206 and polishing surface 204 move in a rotational, orbital, or linear pattern. In addition, wafer carrier assembly 202 and wafer 212 may oscillate relative to polishing surface 204. Adjusting the various conditions of the electrochemical deposition process, such as the electric potential, distance between the electric conductors and the wafer surface, conductivity of the electrolyte solution, temperature, hydrodynamic conditions, and the like, permits suitable control over the uniformity and rate of deposition of conduction material onto the wafer surface.

Figure 8:
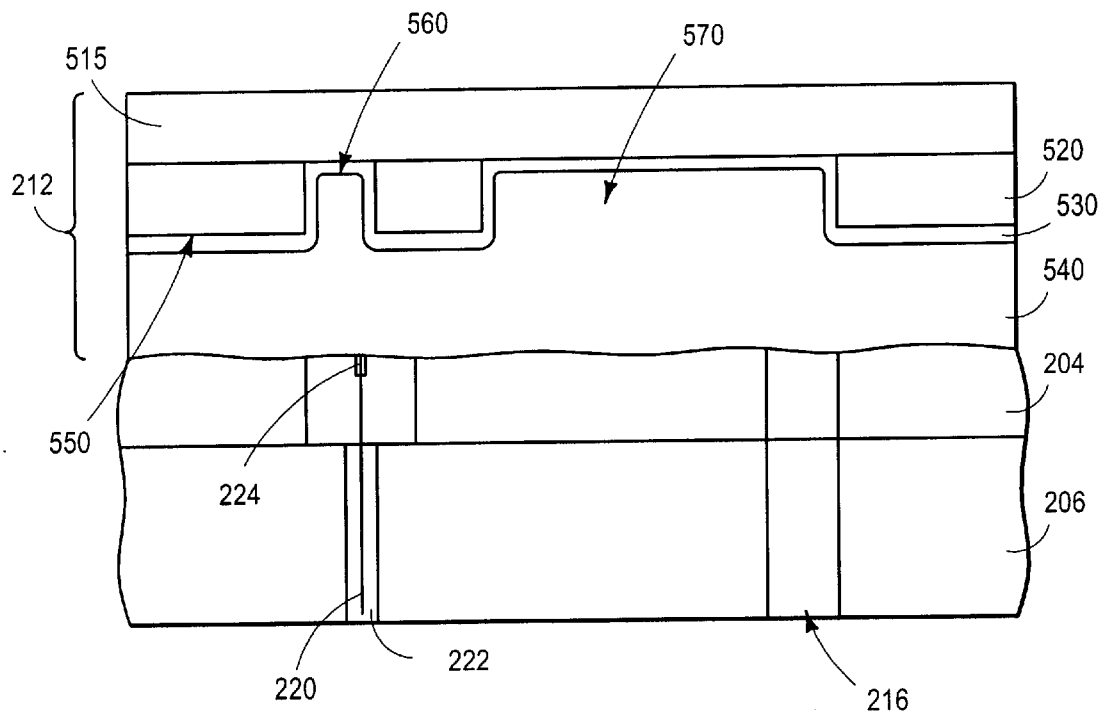
FIG. 8 is a cross-sectional illustration of a workpiece and a polishing surface during a material deposition process in accordance with the present invention.

FIG. 8 illustrates semiconductor wafer undergoing electrochemical deposition and polish using the apparatus and method of the present invention. In accordance with the illustrative example, wafer 212 includes a semiconductor substrate 515, an insulating layer 520 overlying the substrate and formed of, for example, low dielectric constant material, oxide, nitride, or a combination of such materials, underlying a seed layer of material and optionally a barrier layer 530. During the electrochemical deposition process conductive ions in solution 150 are attracted to the relative negative potential of wafer 212 and are reduced at the surface of the wafer to form, for example, a metallic film 540 (e.g., copper). As film 540 forms, a portion of the plated material is removed from planar surfaces (e.g., area 550), such that material is plated into features 560 and 570, while material is simultaneously removed from planar regions (e.g., region 550) of the wafer surface.

During the polishing and deposition process, electrolyte solution is circulated through platen 206 and pad 204 to provide a constant source of ions to the surface of the wafer. As the solution circulates, the solution flows through channels 216 and is distributed across the surface of the wafer.

Figure 9:
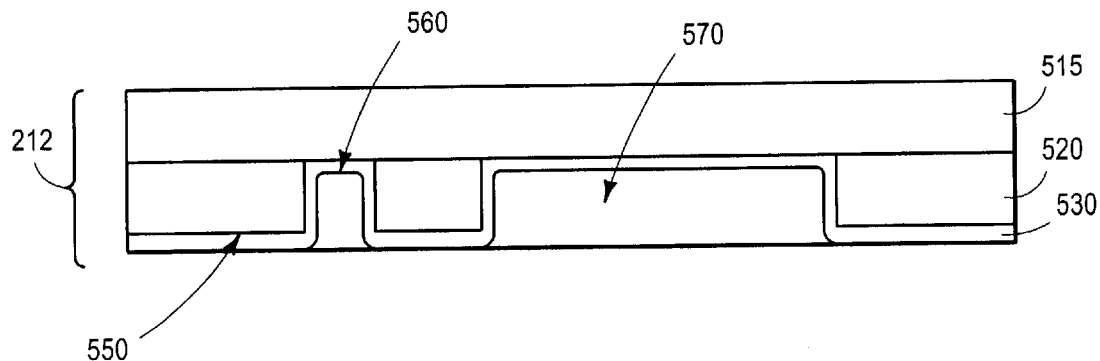
FIG. 9 is a cross-sectional illustration of a workpiece having embedded features formed within an insulating layer using the method of the present invention.

FIG. 9 illustrates wafer 212 a portion of layer 540 has been removed, and before the barrier material has been removed. Material 540 may be removed by standard etching processes, such as wet etch, vapor etch, spray etch, plasma or even chemical mechanical polishing, to form conductive features 610 and 620 within insulating material 520. In accordance with one exemplary embodiment of the invention, the excess material on the surface of wafer 515 is removed using chemical mechanical polishing or electrochemical mechanical polishing, e.g., using one of stations 108–114 illustrated in FIG. 1. The excess material may be removed in the station used to deposit material, or the material may be removed using a separate, dedicated polishing station. In accordance with one embodiment of the invention, a portion of material 540 is removed using electrochemical polishing techniques and a portion of barrier material 530 is removed, using a separate polishing station, from surface 550 using chemical mechanical polishing techniques.

Figure 10:
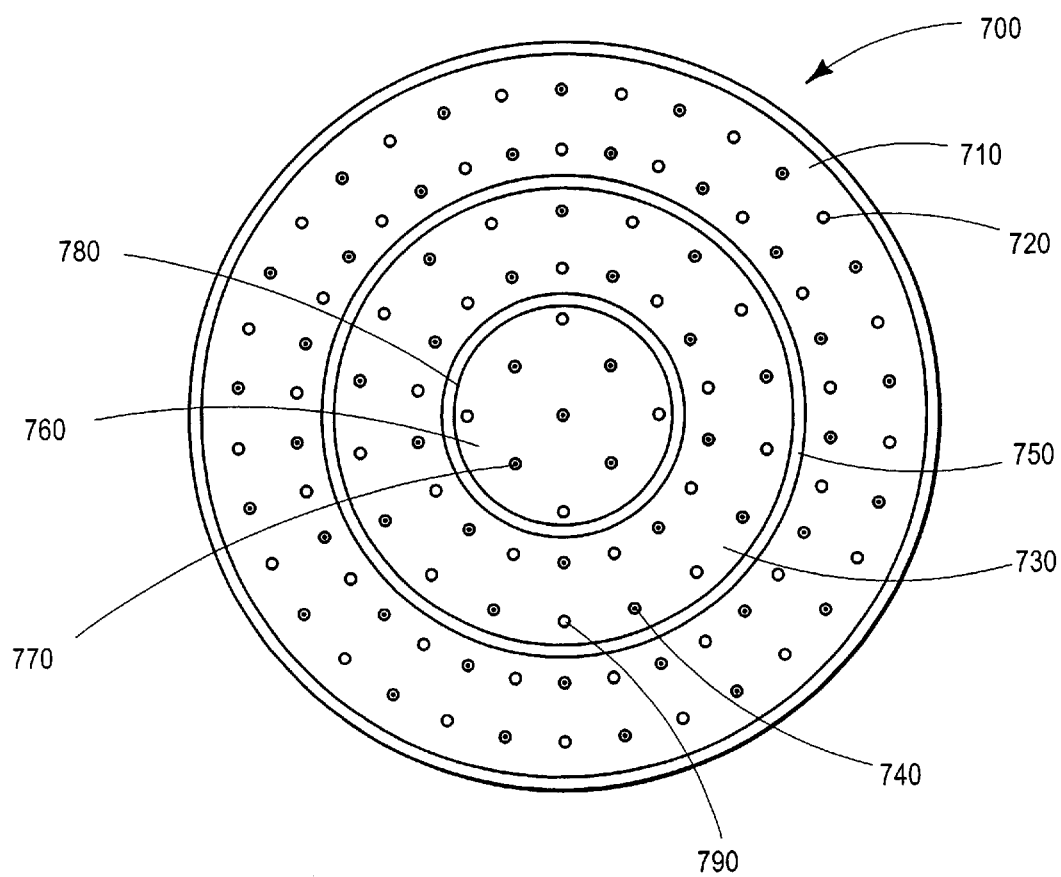
FIG. 10 is a top-view illustration of a platen in accordance with an embodiment of the present invention.

FIG. 10 illustrates another alternative embodiment of a platen of the present invention in which a platen 700 includes "zones" of electrical conductors to which different currents and/or voltages are supplied. Because the center of a wafer carrier (e.g., assembly 202) rotates at a lower velocity at its center than at its periphery, a wafer carried by the wafer carrier may exhibit a different deposition rate of material at the periphery of the wafer compared to the center of the wafer. To counteract this non-uniform deposition across the surface of the wafer, use of "zones" of electrical conductors supplied with different currents may be used. For example, in a first zone 710 one or more electrical conductors 720 may be connected to a first power supply which supplies a first current. In a second zone 730 one or more electrical conductors 740 may be connected to a second power supply which supplies a second current which is different from the first current. The first zone and the second zone may be separated by a first insulator 750. In addition, platen 700 may have a third zone 760 which has one or more electrical conductors 770 connected to a third power supply which supplies a third current, which may be equivalent to the first current or may be different from both the first and the second currents. The third zone may be separated from the second zone by a second insulator 780. While FIG. 10 shows three zones of electrical conductors to which two or more currents are supplied, it will be appreciated that platen 700 may have four or more zones with electrical conductors to which are supplied any suitable currents. Platen 700 may further have channels 790 through which an electrolyte solution is supplied. Using this embodiment, the electric potential supplied to different areas of a wafer may be used to reduce edge effects which result when material is deposited at the peripheral edges of the wafer at a different rate than the material is deposited at the center of the wafer.

In another embodiment (not illustrated), the present invention may be configured for endpoint detection. Referring again to FIG. 8, as the material 540 is deposited onto substrate 515, the resistance of layer 540 decreases, thereby decreasing the voltage through the layer. This change in the electric potential across the layer may be monitored to determine the desired endpoint of the deposition process. Accordingly, the present invention provides the advantage of in-situ endpoint detection without requiring an additional dedicated endpoint detection system.

In the foregoing specification, the invention has been described with reference to specific embodiments. However, it may be appreciated that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be constructed as critical, required, or essential features or elements of any or all of the claims. As used herein, the terms "comprises," "comprising" or any other variation thereof, are intended to cover a non-exclusive inclusion, such that a process, method, article, or apparatus that comprises a list of elements does not include only those elements but may include other elements not expressly listed or inherent to such process, method, article or apparatus.

We claim:

1. An electrical deposition apparatus for depositing material onto a surface of a workpiece, said apparatus comprising:

a polishing surface;

a platen comprising conductive material, said platen disposed proximate said polishing surface;

at least one electrical conductor positioned within said polishing surface;

an electrolyte solution adapted to contact said polishing surface and the workpiece;

a workpiece carrier configured to carry the workpiece and press the workpiece against said polishing surface; and a power supply coupled to said platen and said workpiece carrier;

wherein said power supply applies a bias across said platen and the surface of the workpiece, said bias sufficient to cause material from said electrolyte solution to deposit onto the surface of the workpiece.

2. The apparatus of claim 1, further comprising a contact element which is formed of low electrical resistance material and is connected to said at least one electrical conductor, wherein at least a portion of said contact element is positioned within said polishing surface.

3. The apparatus of claim 2, wherein said contact element is formed of at least one of conductively-enhanced polymer material, ceramic material and inorganic fibers.

4. The apparatus of claim 1, wherein said polishing surface is made of insulating material.

5. The apparatus of claim 1, wherein said polishing surface is porous.

6. The apparatus of claim 1, further comprising a solution application mechanism configured to supply said electrolyte solution to said polishing surface.

7. The apparatus of claim 6, wherein said solution application mechanism comprises at least one channel formed in said platen through which said electrolyte solution may flow.

8. The apparatus of claim 7, wherein said polishing surface includes at least one aperture through which said electrolyte solution from said at least one channel may flow.

9. The apparatus of claim 8, wherein said at least one aperture is configured to expose a portion of said platen to facilitate creation of said electric potential difference between said platen and the surface of the workpiece.

10. The apparatus of claim 1, wherein said polishing surface includes grooves configured to facilitate distribution of said electrolyte solution.

11. The apparatus of claim 1, wherein said polishing surface comprises windows configured to expose portions of said platen to facilitate creation of an electric field of said electric potential difference between said platen and the surface of the workpiece.

12. The apparatus of claim 1, wherein said workpiece carrier is configured to cause relative motion between said workpiece and said polishing surface.

13. The apparatus of claim 12, wherein said relative motion comprises orbital motion.

14. The apparatus of claim 1, wherein said platen is configured to move in an orbital pattern.

15. The apparatus of claim 1, wherein at least a portion of said platen comprises at least one of aluminum, titanium, gold, copper, tantalum and platinum.

16. The apparatus of claim 1, wherein said electrolyte solution comprises copper ions.

17. The apparatus of claim 1, wherein said workpiece carrier is configured to press the workpiece against said polishing surface at a pressure no greater than approximately 2 psi.

18. The apparatus of claim 1, further comprising at least a first group and a second group of electrical conductors, wherein said power source supplies a first current to said first group and a second current to said second group, said first current being different from said second current.

19. The apparatus of claim 1, wherein said electric potential difference alternates between a first electric potential difference and a second electric potential difference.

20. The apparatus of claim 19, wherein said first electric potential difference is zero.

21. The apparatus of claim 1, wherein said electrical potential difference is constant.

22. The apparatus of claim 1, further comprising a temperature control mechanism for counteracting the generation of heat at the surface during deposition.

23. The apparatus of claim 22, further comprising a solution application mechanism configured to supply an electrolyte solution to a surface of said polishing surface, wherein said temperature control mechanism comprises a chiller for cooling said electrolyte solution before said solution is applied to said polishing surface.

24. The apparatus of claim 22, wherein said workpiece carrier comprises a heat exchange fluid for regulating the temperature of the workpiece.

25. The apparatus of claim 1, wherein said platen comprises heat conductive material, wherein said platen is configured to be temperature controlled by a heat exchange fluid circulating therethrough.

26. The apparatus of claim 1, wherein a distance between said platen and the surface of the workpiece is not greater than approximately 3 mm.

27. The apparatus of claim 26, wherein said distance is no greater than approximately 1 mm.

28. The apparatus of claim 27, wherein said distance is no greater than approximately 2000 angstroms.

29. The apparatus of claim 1, wherein the polishing surface comprises a blown polyurethane polishing pad.

30. The apparatus of claim 1, further comprising an endpoint detection system configured to measure a thickness of a film deposited onto the workpiece surface.

31. A polishing system comprising the apparatus of claim 1.

32. The apparatus of claim 1, wherein the apparatus is configured to monitor a change in an electrical resistance across the workpiece as said material from said electrolyte solution is deposited onto the surface of the workpiece.

33. The apparatus of claim 32, wherein the apparatus is further configured to detect an endpoint of deposition of the material onto the surface of the workpiece.

34. A method of depositing a material onto a surface of a workpiece, the method comprising the steps of:
    providing a polishing surface;
    providing a platen comprising a conductive material, said platen disposed proximate said polishing surface;
    providing at least one electrical conductor disposed within said polishing surface;
    pressing said workpiece against said polishing surface while causing relative motion between said workpiece and said polishing surface;
    supplying an electrolyte solution to said polishing surface; and
    applying an electric potential difference between the surface of said workpiece and said platen.

35. The method of claim 34, wherein said electrolyte solution is supplied to said polishing surface through at least one channel formed in said platen.

36. The method of claim 34, wherein said relative motion comprises orbital motion.

37. The method of claim 34, further comprising moving said platen in an orbital pattern.

38. The method of claim 34, wherein said applying an electric potential difference step comprises applying a constant electric potential difference.

39. The method of claim 34, wherein said applying an electrical potential difference step comprises applying an electric potential difference which alternates between a first electric potential difference and a second electric potential difference.

40. The method of claim 39, wherein said first electric potential difference is zero.

41. The method of claim 34, wherein said pressing said workpiece against said polishing surface step comprises pressing said workpiece against said polishing pad at a pressure no greater than approximately 2 psi.

42. The method of claim 34, further comprising a step of providing at least a first group of electrical conductors embedded within said polishing surface and a second group of electrical conductors embedded within said polishing surface, wherein said first group is supplied with a first current and said second group is supplied with a second current.

43. The method of claim 34, further comprising the step of cooling said electrolyte solution before supplying said solution to said polishing surface.

44. The method of claim 34, wherein providing a platen step comprises providing a platen including heat conductive material through which a heat exchange fluid circulates.

45. The method of claim 34, further comprising circulating a heat exchange fluid proximate a surface of said workpiece to counteract the generation of heat at the surface of the workpiece.

46. The method of claim 34, further comprising, during said pressing step, maintaining a distance between said platen and the surface of no greater than 3 mm.

47. The method of claim 34, further comprising, during said pressing step, maintaining a distance between said platen and the surface of no greater than 1 mm.

48. The method of claim 34, further comprising, during said pressing step, maintaining a distance between said platen and the surface of no greater than 2000 angstroms.

49. The method of claim 34, wherein said supplying an electrolyte solution comprises supplying an electrolyte solution including copper ions.

50. The method of claim 34, further comprising monitoring a change in an electrical resistance across the workpiece during said applying an electric potential difference.

51. The method of claim 34 further comprising detecting an endpoint of deposition of the material onto the surface of the workpiece.

52. An apparatus for electrochemically depositing a material onto a surface of a workpiece, comprising:
    a polishing surface;
    an electrically conductive surface disposed proximate to said polishing surface;
    at least one conducting element disposed within said polishing surface;
    a workpiece carrier configured to press the workpiece against said polishing surface; and
    a power source configured to apply an electric bias between the surface of the workpiece and said electrically conductive surface.

53. The apparatus of claim 52, further comprising at least one passage disposed in said polishing surface, wherein the surface of the workpiece and said electrically conductive surface are adapted to be in fluid communication through said passage when the workpiece is pressed against said polishing surface.

54. The apparatus of claim 52, wherein said electrically conductive surface comprises a surface of a polishing platen.

55. The apparatus of claim 54, further comprising a conduit disposed in said polishing platen.

56. The apparatus of claim 52, wherein said polishing surface comprises a plurality of grooves.

57. The apparatus of claim 56, further comprising at least one fluid passage disposed in said polishing surface, wherein said at least one fluid passage is in fluid communication with at least one of said plurality of grooves.

58. The apparatus of claim 57, wherein said electrically conductive surface comprises a polishing platen having at least one conduit positioned therethrough, and wherein said at least one conduit is in fluid communication with said at least one fluid passage.

59. The apparatus of claim 52, further comprising a contact element formed of low electrical resistance material connected to said conducting element, wherein said contact element is in electrical communication with said conducting element and the surface of the workpiece.

60. The apparatus of claim 52, wherein said workpiece carrier is configured to cause relative motion between said workpiece and said polishing surface.

61. A multi-station polishing system including the apparatus of claim 52.

62. The apparatus of claim 52, wherein the apparatus is configured to monitor a change in an electrical resistance across the workpiece during depositing of the material onto the surface of the workpiece.

63. The apparatus of claim 62, wherein the apparatus is further configured to detect an endpoint of deposition of the material onto the surface of the workpiece.

64. The apparatus of claim 52, further comprising a driver motor operably connected to the polishing surface and the electrically conductive surface to produce orbital motion thereof.

65. A workpiece electrochemical deposition system comprising:
a workpiece load and unload station;
a clean system; and
a polishing system, wherein said polishing system includes at least one station configured for electrochemical deposition, said station comprising a polishing surface having electrical conductors embedded therein.

66. The workpiece polishing system of claim 65, wherein said polishing system further comprises a polishing station configured to perform chemical mechanical polishing of a surface of the workpiece.

67. The workpiece polishing system of claim 65, further comprising a spin rinse dryer.

68. The workpiece polishing system of claim 65, wherein said polishing system further comprises a buff station.

69. The workpiece polishing system of claim 65, further comprising a least one robot configured to transport the workpiece from said load and unload station to said polishing system.

70. The workpiece polishing system of claim 65, further comprising a least one robot configured to transport the workpiece from said polishing system to said clean system.

71. The workpiece polishing system of claim 65, wherein said clean system includes a brush clean station.

72. The workpiece polishing system of claim 65, wherein said clean system includes a robot configured to transport a workpiece from a clean station to a spin rinse dryer.

73. The workpiece polishing system of claim 65, further comprising a metrology station.

74. A workpiece electrochemical deposition system comprising:
an electrochemical polishing station including a polishing surface; and
a plurality of workpiece carrier apparatus coupled to a central hub,
wherein at least one of said plurality of workpiece carrier apparatus is configured to urge a workpiece against the polishing surface during a material deposition process.

75. An apparatus for electrochemically depositing a film onto a surface of a workpiece, the apparatus comprising:
a polishing surface atop a rigid platen;
a driver motor operably connected to the rigid platen to produce orbital motion thereof;
an electrically conductive surface disposed proximate to the polishing surface and the rigid platen;
a plurality of conducting elements disposed at least partially in the polishing surface;
an electrolyte solution in contact with the polishing surface and the workpiece;
a workpiece carrier configured to press the workpiece against the polishing surface; and
a power source connected to the plurality of contact elements and the electrically conductive surface and configured to apply an electric potential difference between the workpiece and the electrically conductive surface to thereby deposit a film onto the surface of the workpiece.

76. An apparatus for electrochemically depositing a material onto a surface of a workpiece, the apparatus comprising:
a polishing pad;
a conducting surface disposed proximate the polishing pad; and
a plurality of contact elements disposed within said polishing pad, said contact elements configured to contact the surface of the workpiece when the workpiece is pressed against the polishing pad, said contact elements further configured for electrical communication with a power source for applying an electric potential between the surface of the workpiece and the conducting surface.

77. The apparatus of claim 76, wherein said plurality of contact elements is formed of at least one of conductively-enhanced polymer material, ceramic material and inorganic fibers.

78. A method of depositing a material onto a surface of a workpiece, the method comprising:
providing a polishing pad;
providing a conductive surface disposed proximate the polishing pad;
providing a plurality of contact elements disposed within said polishing pad;
pressing the workpiece against said polishing pad while causing relative motion between the workpiece and the polishing pad;
causing the surface of the workpiece to contact said plurality of contact elements during said pressing, and
applying an electric potential difference between the plurality of contact elements and the conductive surface.

79. The method of claim 78, further comprising supplying an electrolytic solution to a polishing surface of said polishing pad.

* * * * *